United States Patent
Fujiwara et al.

(10) Patent No.: US 12,288,964 B2
(45) Date of Patent: Apr. 29, 2025

(54) METHOD FOR MANUFACTURING OPTICAL SEMICONDUCTOR WAVEGUIDE WINDOW STRUCTURE

(71) Applicant: Nippon Telegraph and Telephone Corporation, Tokyo (JP)

(72) Inventors: Naoki Fujiwara, Musashino (JP); Takahiko Shindo, Musashino (JP); Shigeru Kanazawa, Musashino (JP); Meishin Chin, Musashino (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 731 days.

(21) Appl. No.: 17/618,789

(22) PCT Filed: Jun. 17, 2019

(86) PCT No.: PCT/JP2019/023812
§ 371 (c)(1),
(2) Date: Dec. 13, 2021

(87) PCT Pub. No.: WO2020/255183
PCT Pub. Date: Dec. 24, 2020

(65) Prior Publication Data
US 2022/0239066 A1  Jul. 28, 2022

(51) Int. Cl.
*H01S 5/16* (2006.01)
*G02B 6/42* (2006.01)
*H01S 5/026* (2006.01)
*H01S 5/12* (2021.01)
*H01S 5/227* (2006.01)

(52) U.S. Cl.
CPC .......... *H01S 5/1231* (2013.01); *G02B 6/4207* (2013.01); *H01S 5/0265* (2013.01); *H01S 5/16* (2013.01); *H01S 5/2275* (2013.01); *H01S 5/164* (2013.01)

(58) Field of Classification Search
CPC .......... H01S 5/0265; H01S 5/16; H01S 5/164
See application file for complete search history.

(56) References Cited

U.S. PATENT DOCUMENTS

| 6,052,397 | A   |   | 4/2000 | Jeon et al. |
| 6,358,316 | B1  | * | 3/2002 | Kizuki .............. H01L 21/02395 257/E21.232 |
| 2003/0026576 | A1 |   | 2/2003 | Asous et al. |
| 2004/0057486 | A1 | * | 3/2004 | Watanabe ........... H01S 5/34326 372/46.01 |

(Continued)

FOREIGN PATENT DOCUMENTS

| JP | 2000-188441 A | 7/2000 |
| JP | 2009-094410 A | 4/2009 |

(Continued)

*Primary Examiner* — Michael Carter
(74) *Attorney, Agent, or Firm* — Workman Nydegger

(57) ABSTRACT

Provided is a semiconductor light source element or an optical device including a semiconductor optical waveguide of a high-mesa semi-insulated embedded structure having a window structure made of the same material as an overclad layer at a light emission end, and a method for manufacturing thereof, in which an active layer at a portion of the window structure is removed, and then the same layer as the overclad layer is formed.

4 Claims, 14 Drawing Sheets

(56) References Cited

U.S. PATENT DOCUMENTS

| | | | |
|---|---|---|---|
| 2005/0202679 A1* | 9/2005 | Stoltz | H01S 5/22 438/694 |
| 2008/0219315 A1* | 9/2008 | Makino | H01S 5/12 372/50.1 |
| 2013/0207140 A1 | 8/2013 | Makino et al. | |
| 2016/0149379 A1 | 5/2016 | Gotoda et al. | |
| 2021/0111541 A1* | 4/2021 | Kubota | H01S 5/0207 |

FOREIGN PATENT DOCUMENTS

| | | |
|---|---|---|
| JP | 58-23920 A | 10/2015 |
| JP | 2016-072608 A | 5/2016 |
| JP | 2018-060973 A | 4/2018 |

\* cited by examiner

Fig. 13
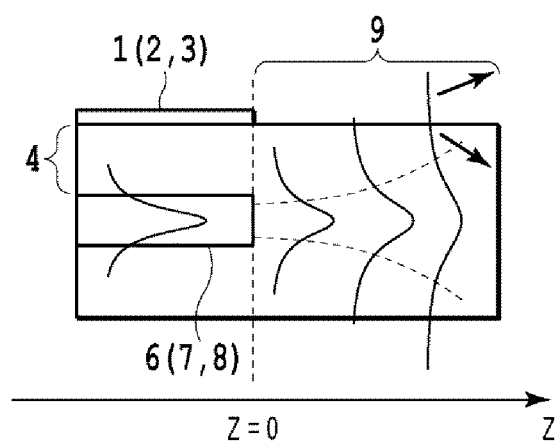
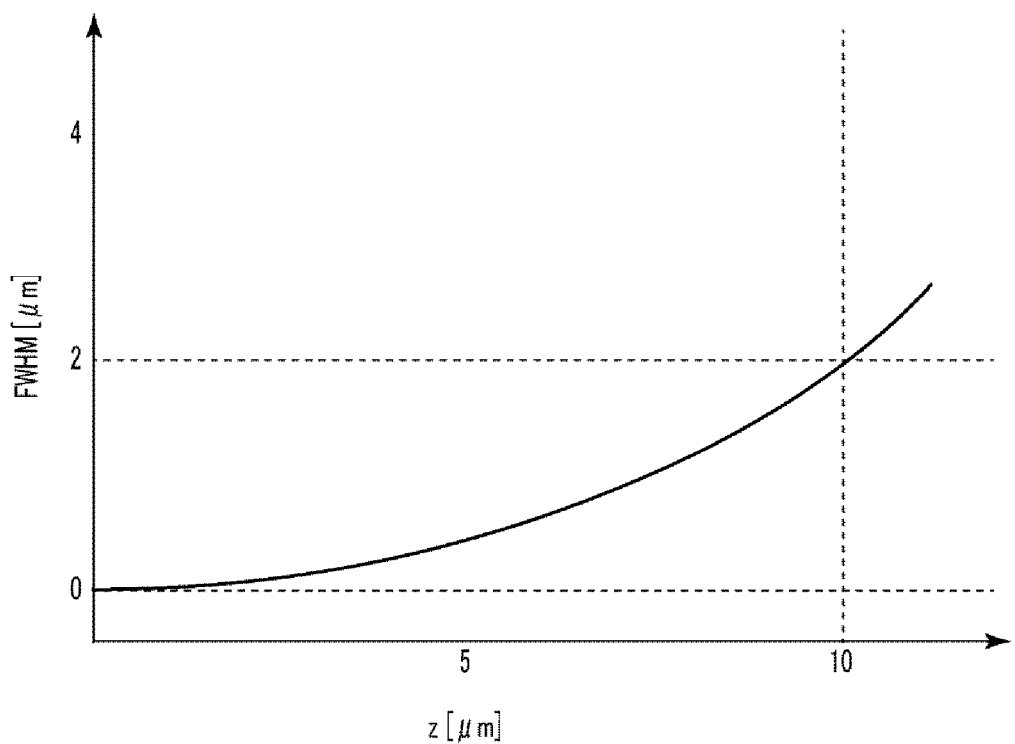

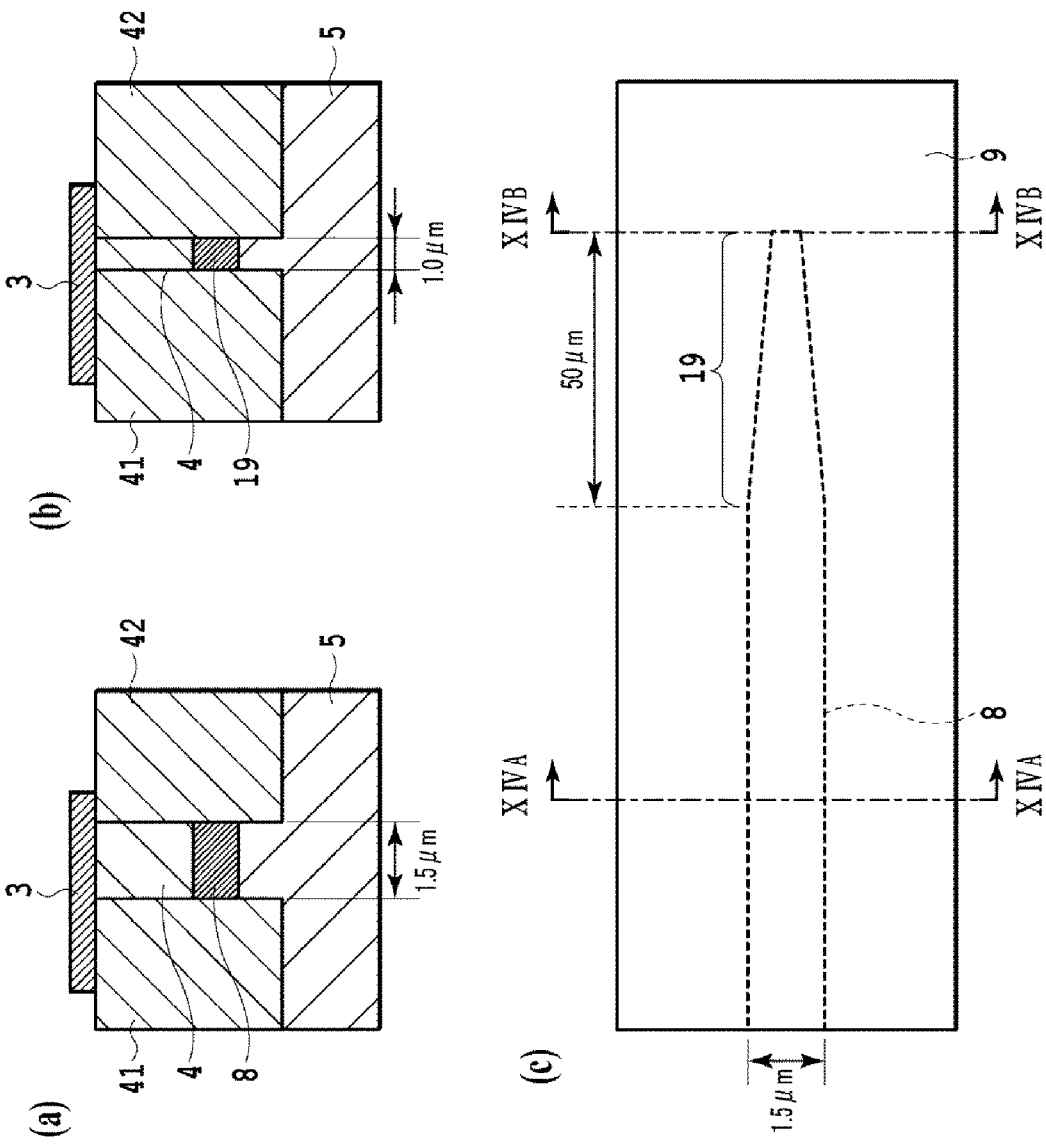

METHOD FOR MANUFACTURING OPTICAL SEMICONDUCTOR WAVEGUIDE WINDOW STRUCTURE

TECHNICAL FIELD

The present invention relates to a semiconductor light source element and a manufacturing method of an optical semiconductor waveguide window structure.

BACKGROUND ART

A high-mesa semi-insulating embedded structure used in a modulator integrated laser (a semiconductor light source element) called a direct modulation laser or an EA-DFB laser enables high-speed modulation of a semiconductor laser due to high frequencies by reducing capacitance components. In such a semiconductor laser, reflected return light of laser light from an emission end face adversely affects an operation of an integrated DFB laser and a DBR laser. With a conventional laser light output of about −2 dBm to +5 dBm, no major problem has occurred. However, in recent years, with the promotion of extension and multi-branching of optical fiber networks, there is a growing need for a modulated laser to provide a high output at least twice that of a conventional one.

CITATION LIST

Patent Literature

[PTL 1] Japanese Patent No. 5823920

SUMMARY OF THE INVENTION

Technical Problem

To meet such a need, when an integrated laser itself is made to provide a higher output, or semiconductor optical amplifiers (SOA) are integrated at an emission end of the laser light to achieve a higher output, an operation of laser becomes unstable due to return light from an end face of a laser chip.

In the past, an anti-reflection film (an AR film) was formed at an emission end of laser light to reduce reflectance and reduce return light, but in a modulated laser exceeding +5 dBm, the AR film alone is not sufficient, and it is necessary to devise an optical waveguide.

A structure in which a tip of a terminating end of an optical waveguide is embedded with the same material as a clad layer is called a window structure, but this window structure technique is often used alongside a regrowth method called pn embedding and used for a high power light source exceeding 20 mW. Since a height of a mesa-embedded structure embedded using pn embedding is relatively low at 2 μm or less, such a window structure can be realized.

On the other hand, when a window structure is applied to high-mesa semi-insulating embedding used for high-speed modulation, problems occur such as, in addition to a mesa height exceeding 3 μm, abnormal growth occurring on a crystal plane of (0 −1 −1) plane in a light propagation path, which causes voids and crystal defects, and a regrowth layer rising on a mask (for embedded selective growth) left on an upper portion of a mesa at the time of embedded growth, which results in poor electrical contact with a semiconductor.

This is caused by a 90 degree difference in orientation between side walls ((0 1 −1) plane and (0 −1 1) plane) of the mesa and a crystal plane of a terminating end portion of the mesa, which results in technical difficulty in embedded growth on the (0 −1 −1) plane and (0 1 1) plane at the terminating end portion. In addition, since the height of the mesa greatly exceeds 2 μm (about 3 μm or more), the mesa having a high height (a high mesa) with respect to the crystal orientation at which growth is difficult also raises the technical difficulty.

Also, the symbol "−" in the crystal plane notation would normally be written above the number to the right of the symbol "−", but is written on the left of the number in the present specification for convenience.

The present invention has been made to solve such a problem, and an object of the present invention is to realize a semiconductor light source element having a high-mesa semi-insulating embedded window structure that enables a high output and high-speed modulation, and a manufacturing method of a window structure of an optical semiconductor waveguide of such a semiconductor light source element or an optical device.

Means for Solving the Problem

An example of an embodiment of the present invention is characterized by including the following configurations in order to achieve such an object.
(Configuration 1)
A semiconductor light source element comprising a semiconductor optical waveguide of a high-mesa semi-insulating embedded structure having a window structure made of the same material as an overclad layer at a light emission end.
(Configuration 2)
The semiconductor light source element according to configuration 1, wherein a light source is a DFB laser, and the semiconductor light source element comprises an EA layer mounted between the DFB laser and a portion formed the window structure.
(Configuration 3)
The semiconductor light source element according to configuration 2, the semiconductor light source element comprises an SOA layer mounted between the EA layer and the portion formed the window structure.
(Configuration 4)
A method for manufacturing the semiconductor light source element according to configuration 1, the method comprising, to form the window structure at a light emitting portion of the semiconductor optical waveguide:
    removing a core layer of a portion serving as the window structure by etching in a process before growing the overclad layer; and,
    forming the same layer as the overclad layer crystal-grown on the core layer of the semiconductor optical waveguide at the portion of the window structure.
(Configuration 5)
The method for manufacturing the semiconductor light source element according to configuration 1, the method comprising, in a manufacturing process of a DFB laser serving as a light source:
    forming a diffraction grating on an active layer of the DFB laser;
    removing an active layer of a portion of the window structure so that a portion serving as the active layer of the DFB laser is left, in order to make at least one of portions serving as cleavage end faces into the window structure in a process before growing an overclad layer; and, forming the same layer as the overclad layer crystal-grown on a core layer of the semiconductor optical waveguide at the portion of the window structure.

(Configuration 6)

The method for manufacturing the semiconductor light source element according to configuration 2, the method comprising:

forming a diffraction grating on an active layer of the DFB laser to make the EA layer grow through butt joint growth;

removing an EA core layer at the portion of the window structure in order to form a portion serving as a cleavage end face on a side serving as an output end of light at a tip of the EA layer to be the window structure in a process before growing the overclad layer; and, forming the same layer as the overclad layer crystal-grown on a core layer of the semiconductor optical waveguide at the portion at which the EA core layer is removed.

(Configuration 7)

The method for manufacturing the semiconductor light source element according to configuration 3, the method comprising:

forming a diffraction grating on an active layer of the DFB laser to make the EA layer grow through butt joint growth;

removing the SOA layer at the portion of the window structure in order to form a portion serving as a cleavage end face on a side serving as an output end of light at a tip of the SOA layer to be the window structure in a process before growing the overclad layer; and, forming the same layer as the overclad layer crystal-grown on a core layer of the semiconductor optical waveguide at the portion at which the SOA layer is removed.

(Configuration 8)

A method for manufacturing an optical device comprising an optical waveguide or a laser, the method comprising:

removing a portion other than a portion intended to be left as an optical waveguide by etching in the same manner as a window structure forming portion in an etching process for forming a window structure before growing an overclad layer; and, performing the growth of the overclad layer and subsequent processes.

Effects of the Invention

With such a configuration, the present invention can realize a semiconductor light source element having a high-mesa semi-insulating embedded window structure that enables a high output and high-speed modulation, and a manufacturing method of a window structure of an optical semiconductor waveguide of such a semiconductor light source element.

BRIEF DESCRIPTION OF DRAWINGS

FIG. 13 shows a cross-sectional view (a) of a substrate at a window structure portion according to an embodiment of the present invention and a graph (b) showing a vertical expansion of an optical field.

FIG. 14 shows cross-sectional views (a) and (b) of a substrate of an SOA and a tapered region according to an embodiment of the present invention and a top view (c) of a chip.

DESCRIPTION OF EMBODIMENTS

Hereinafter, embodiments of the present invention will be described in detail with reference to the figures.

(Semiconductor Light Source Element of Embodiment)

Figure 1:
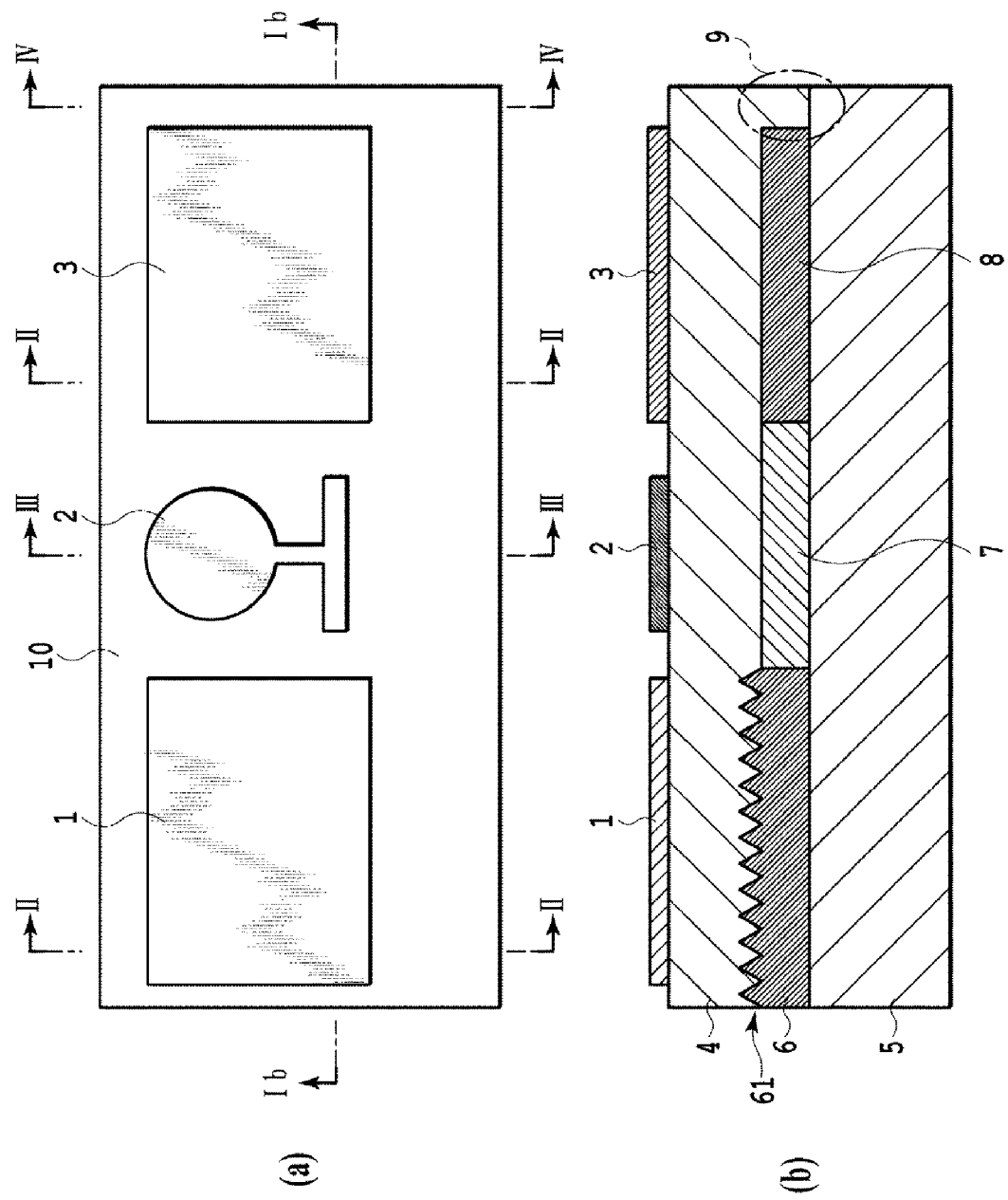
FIG. 1 shows a top view (a) of a semiconductor light source element according to an embodiment of the present invention, and a cross-sectional view (b) of a substrate along a cross-section Ib-Ib.

FIG. 1 is a top view (a) of a semiconductor light source element of an embodiment and a cross-sectional view (b) of a substrate along a cross-section Ib-Ib thereof.

In the top view of FIG. 1(a), a laser electrode 1 of a DFB laser, an EA electrode 2 of an EA modulator, and a semiconductor optical amplifier (SOA) electrode 3 of an SOA are shown on an upper surface of a chip 10 of the semiconductor light source element.

In the cross-sectional view of the substrate of FIG. 1(b), a cross-section of a p-InP overclad layer 4 is seen below cross-sections of the laser electrode 1, the EA electrode 2, and the SOA electrode 3, and below that, a core layer 6 of the DFB laser, a core layer 7 of the EA modulator, and a core layer 8 of the SOA are disposed in order to form a semiconductor optical waveguide. Laser light oscillated by the DFB laser is modulated by the EA modulator, optically amplified by the semiconductor optical amplifier (SOA), and emitted as modulated laser light via a window structure 9 surrounded by a dotted line at a right end. The window structure 9 is made of the same material as the p-InP overclad layer 4.

A diffraction grating 61 represented by a triangular wavy line is formed at a boundary portion of an upper surface of the core layer 6 of the DFB laser in contact with the p-InP overclad layer 4, but no diffraction grating is formed at a boundary portion of the core layer 8 of the SOA. A cross-section of an n-InP underclad layer 5 is seen under the core layers 6 to 8 and the window structure 9.

Figure 2:
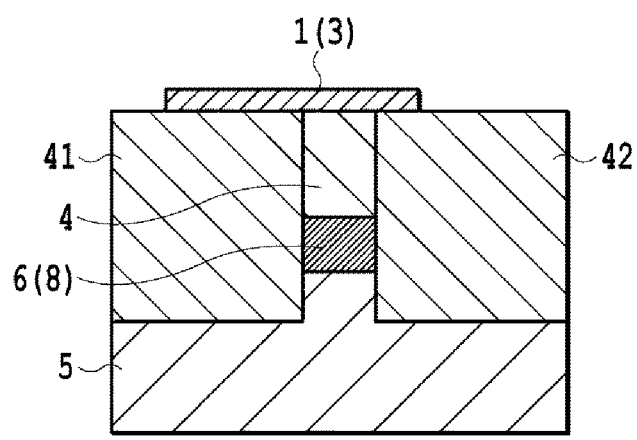
FIG. 2 is a cross-sectional view of the substrate along a cross-section II-II in FIG. 1

A cross-sectional view of the substrate of FIG. 2 is a diagram of a cross-section II-II of the substrate perpendicular to an optical axis of the DFB laser in FIG. 1, and a cross-section of the semiconductor optical amplifier (SOA) portion has almost the same structure. In FIG. 2, the p-InP overclad layer 4 and semi-insulating SI-InP lateral clad layers 41 and 42 are below the laser electrode 1, the core layer 6 of the DFB laser (in the cross-section of the SOA, the core layer 8 of the SOA) is below the p-InP overclad layer 4, and a bottom layer is the n-InP underclad layer 5. In the cross-sectional view of the substrate of the DFB laser of FIG. 2, there is a cross-section of the diffraction grating 61 between the p-InP overclad layer 4 and the core layer 6 of the DFB laser, which is omitted in the figure.

Figure 3:
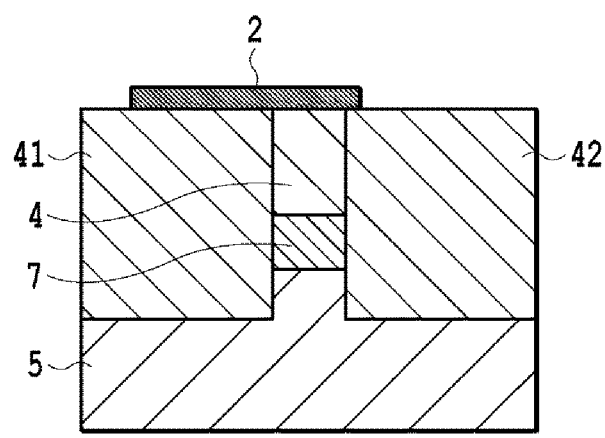
FIG. 3 is a cross-sectional view of the substrate along a cross-section III-III in FIG. 1.

Similarly, a cross-sectional view of the substrate of FIG. 3 is a diagram of a cross-section III-III of the substrate perpendicular to an optical axis of the EA modulator portion of FIG. 1, in which the p-InP overclad layer 4 and the SI-InP lateral clad layers 41 and 42 are below the EA electrode 2, the core layer 7 of the EA modulator is below the p-InP overclad layer 4, and the bottom layer is the n-InP underclad layer 5.

Figure 4:
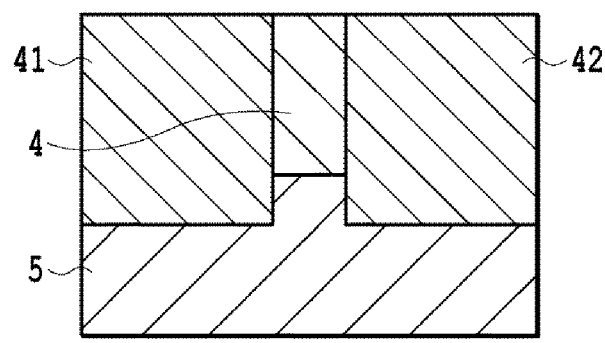
FIG. 4 is a cross-sectional view of the substrate along a cross-section IV-IV in FIG. 1.

A cross-sectional view of the substrate of FIG. 4 is a diagram of a cross-section IV-IV of the substrate perpendicular to an optical axis of a portion of the window structure 9 of FIG. 1, in which there are no electrodes on a top layer, and the p-InP overclad layer 4 and the SI-InP lateral clad layers 41 and 42, which are in contact with the n-InP underclad layer 5 that is the bottom layer, without any core layer interposed below the p-InP overclad layer 4.

With such a structure, the semiconductor light source element having the window structure that is a high-mesa semi-insulating embedded structure with few vacancies and crystal defects is realized and serves as an optical device that enables a high output and high-speed modulation.

The window structure of the embodiment described above is effective as a countermeasure against return light even for a semiconductor laser that does not include SOA or EA and for an optical device that does not include a laser as a light source and has only an optical waveguide, and can be effectively applied to an optical device including a semiconductor optical waveguide that has a particularly high-mesa semi-insulating embedded structure and has a window structure at a light emission end made of the same material as the overclad layer.

(Manufacturing Method of Embodiment)

Next, a manufacturing method of the semiconductor light source element of the embodiment will be described.

In the manufacturing method of the present invention, before the overclad layer of the semiconductor light source element is grown, the core layer at a portion serving as the window structure is removed, and overclad growth is performed on the entire surface of a wafer. Then, by performing a normal semi-insulating embedding process, high-mesa semi-insulating embedded growth can be performed without exposing the (0 −1 −1) plane, and the window structure with few vacancies and crystal defects can be realized.

Figure 5:
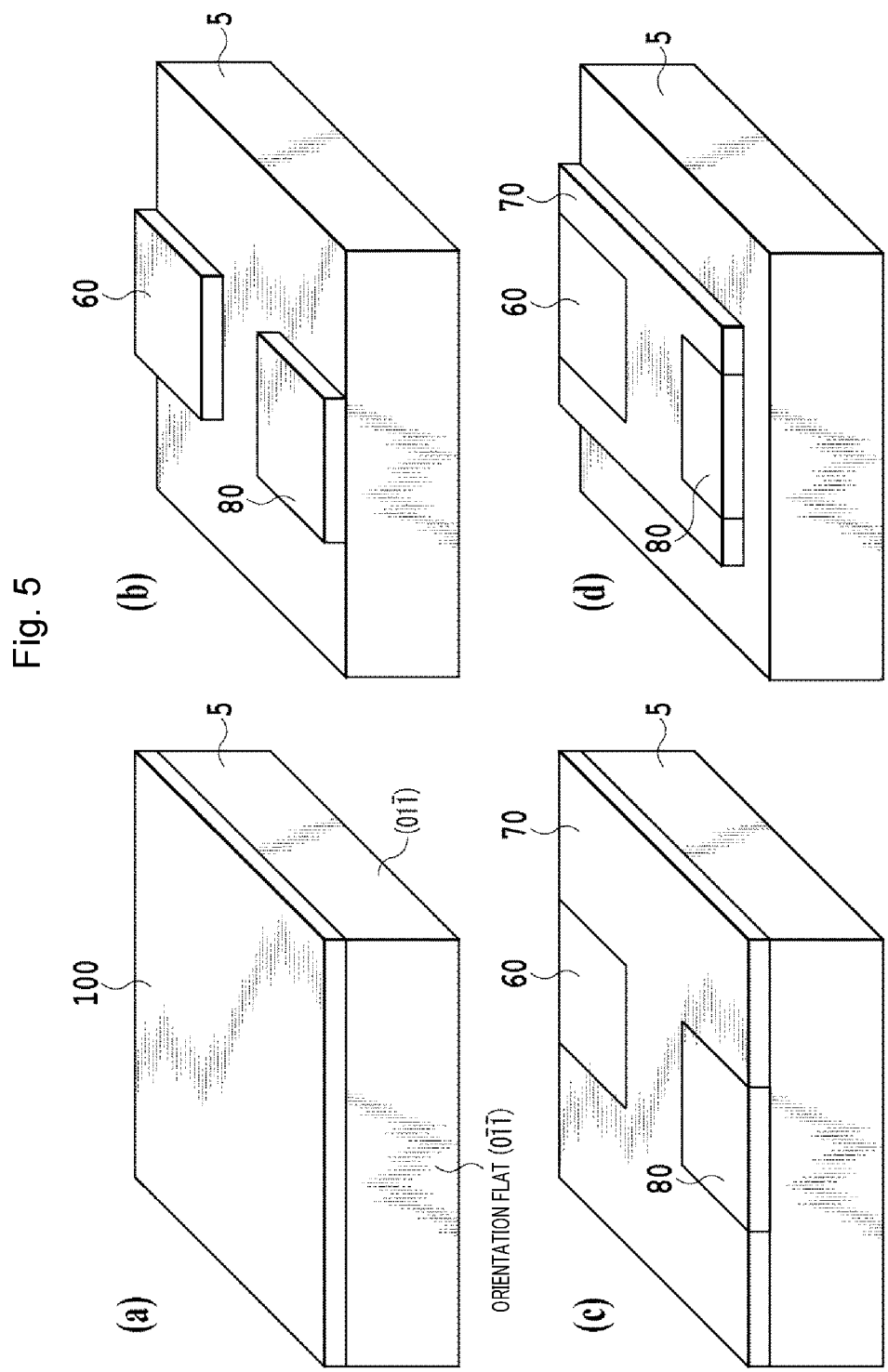
FIG. 5 is a diagram illustrating producing processes (a) to (d) of a manufacturing method of the semiconductor light source element according to the embodiment of the present invention.
Figure 6:
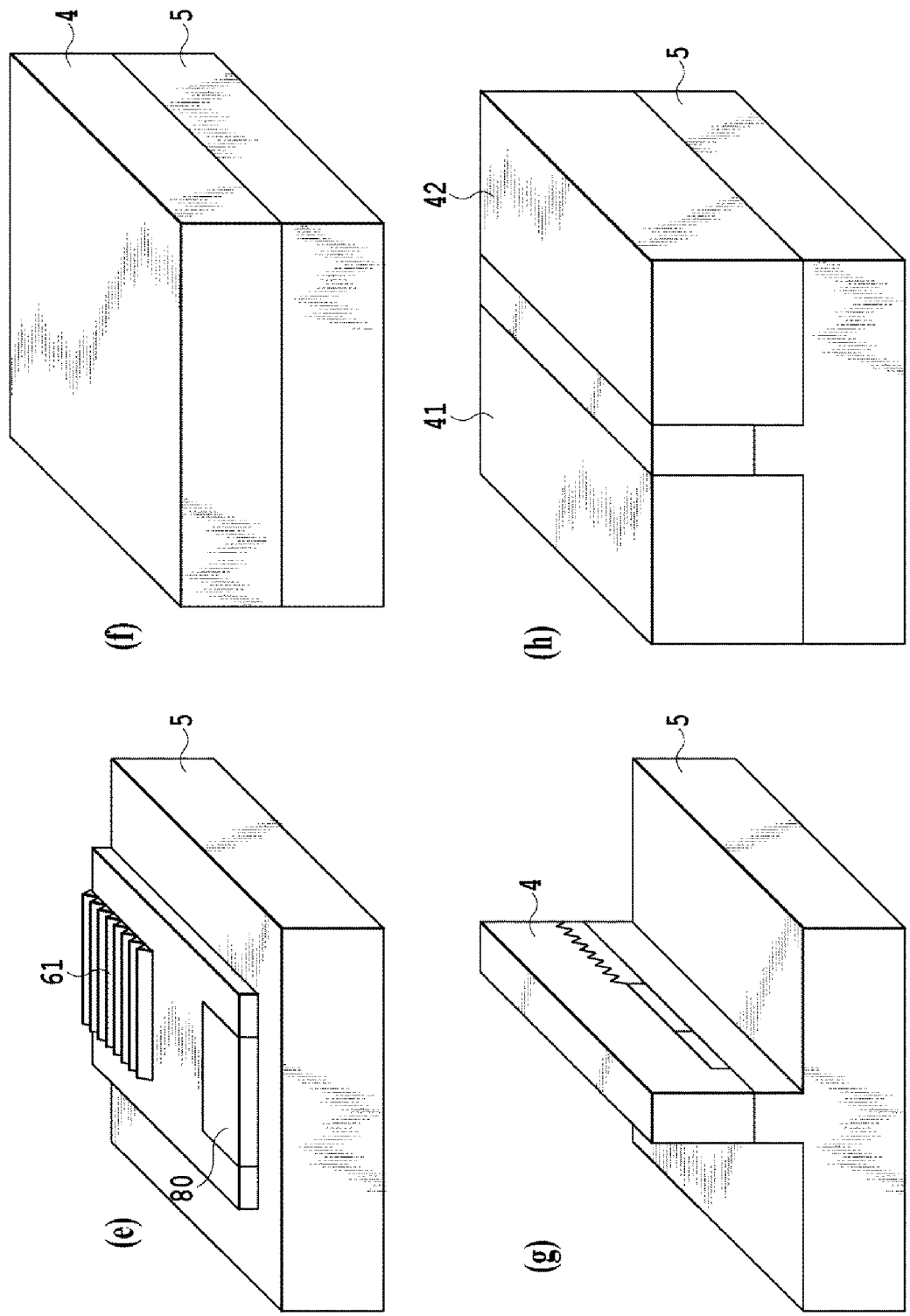
FIG. 6 is a diagram illustrating producing processes (e) to (h) of the manufacturing method of the semiconductor light source element according to the embodiment of the present invention.

FIGS. 5 and 6 are diagrams for explaining producing processes (a) to (d) and (e) to (h) of the manufacturing method of the semiconductor light source element of the embodiment.

In the processes of the present manufacturing method, first, as shown in FIG. 5(a), a multiple quantum well (MQW) layer (a layer with a multiple quantum well structure, hereinafter referred to as an active layer 100) having an optical gain was crystal-grown on an n-type InP substrate 5, in which a crystal orientation of a surface thereof was the (1 0 0) plane and an orientation flat (also called OF, which is a reference plane on a circumference of a substrate for aligning an orientation of a wafer during a process) thereof was the (0 −1 −1) plane. In the figures below, the orientation of the crystal plane of the substrate is the same.

Then, the active layer 100 was partially removed by selective etching to obtain the state shown in FIG. 5(b). At this time, the active layer 100 is etched such that an optical waveguide (a mesa stripe) formed after that is perpendicular to the orientation flat. An SiO$_2$ mask is provided for selective etching directly above the remaining portions 60 and 80 of the active layer 100, but is not shown in the figure. In FIG. 5(b), the active layers 60 and 80 are portions that will later become the core layer 6 of the DFB laser and the core layer 8 of the SOA, respectively.

As shown in FIG. 5(c), using a selective etching mask used in FIG. 5(b) as it was as a selective growth mask without removing it, an MQW active layer serving as the EA core layer 7 (hereinafter referred to as an EA layer 70) was regrown through butt joint growth. Then, the SiO$_2$ mask used in the selective etching and selective growth was temporarily removed to form a new selective etching mask with SiO$_2$, and as shown in FIG. 5(d), portions of each of the active layer 80 and the EA layer 70 were removed, respectively. This process is the point in which the core layer of the window structure portion corresponding to an output portion of light is removed before the overclad layer and the mesa structure are formed.

After that, the selective etching mask was removed, and the diffraction grating 61 was formed in a portion serving as the DFB laser as shown in FIG. 6(e). In the state of FIG. 6(e), there is no SiO$_2$ on a surface of the wafer, and the semiconductor is exposed on the entire surface. Next, as shown in FIG. 6(f), the p-type InP overclad layer 4 was formed on the entire surface of the wafer. When the InP overclad layer 4 is formed in this way, InP having good crystal quality can be grown in the portion serving as the window structure.

Next, in order to form the optical waveguide, an SiO$_2$ mask for dry processing was formed, and dry etching was performed to obtain the state shown in FIG. 6(g). In this dry etching process, the core layer was penetrated and processed to dig into a portion of the underclad 5 to form the mesa stripe. A feature of this mesa stripe is that the portions of the clad layer and core layer, which have a light confinement function due to a difference in refractive index therebetween, and the portions serving as the window structure, which does not have a confinement function, are collectively processed into the mesa. For this reason, the point is that the (0 −1 −1) plane and the (0 1 1) plane are not in an exposed state, and InP with good crystal quality can be grown in the portion serving as the window structure.

A width of the mesa was set to about 1.5 μm in order to inhibit excitation in a higher-order lateral mode. Finally, a semi-insulating InP layer was embedded and grown as the lateral clad layers 41 and 42, but the (0 −1 −1) plane and the (0 1 1) plane, which are unsuitable for embedded growth, were not exposed, and thus InP did not rise on the selective growth mask of the mesa, and good embedded growth with few vacancies and crystal defects could be realized. Then, electrodes were formed in regions serving as the laser, the EA, and the SOA, thereby completing the device. A length of the window structure portion in a traveling direction of light is 7 μm.

The manufacturing method of the window structure of the embodiment described above is effective as a countermeasure against return light even for a semiconductor laser that does not include SOA or EA and for an optical device that does not include a laser as a light source and has only an optical waveguide, and can be effectively applied to an optical device including a semiconductor optical waveguide that has a particularly high-mesa semi-insulating embedded structure and has a window structure at a light incidence and emission end made of the same material as the overclad layer.

For example, as a basic manufacturing method of the semiconductor light source element, to form the window structure at a light emitting portion of the semiconductor optical waveguide, in the process before growing the overclad layer, a core layer of a portion serving as the window structure may be removed by etching, and the same layer as the overclad layer crystal-grown on the core layer of the semiconductor optical waveguide may be formed at the portion of the window structure.

Also, as a manufacturing method of the semiconductor light source element provided with the DFB laser as a light source, in a manufacturing process of the DFB laser, the diffraction grating may be formed on the active layer of the DFB laser, then in the process before growing an overclad layer, the portion serving as the active layer of the DFB laser may be left, an active layer of the portion of the window structure may be removed in order to make at least one of portions serving as cleavage end faces into the window structure, and the same layer as the overclad layer crystal-grown on a core layer of the semiconductor optical waveguide may be formed at the portion of the window structure.

Further, in the case of a DFB laser equipped with the EA modulator, the diffraction grating may be formed on the active layer of the DFB laser and the EA layer may be grown through butt joint growth, then in the process before growing the overclad layer, the EA layer at the portion of the window structure may be removed in order to form a portion serving as a cleavage end face on a side serving as an output end of light at a tip of the EA layer to be the window structure, and the same layer as the overclad layer crystal-grown on a core layer of the semiconductor optical waveguide may be formed at the portion at which the EA layer is removed.

Furthermore, in the case of an EA-modulated DFB laser equipped with the SOA, the diffraction grating may be formed on the active layer of the DFB laser and the EA layer may be grown through butt joint growth, then in the process before growing the overclad layer, the SOA layer at the portion of the window structure may be removed in order to form a portion serving as a cleavage end face on a side serving as an output end of light at a tip of the SOA layer to be the window structure, and the same layer as the overclad layer crystal-grown on a core layer of the semiconductor optical waveguide may be formed at the portion at which the SOA layer is removed.

In addition, in the case of an optical device including an optical waveguide or a laser, in an etching process for forming the window structure before growing an overclad layer, a portion other than a portion intended to be left as the optical waveguide may be removed by etching in the same manner as a window structure forming portion, and then the growth of the overclad layer and subsequent processes may be performed.

(Conventional Manufacturing Method)

Figure 7:
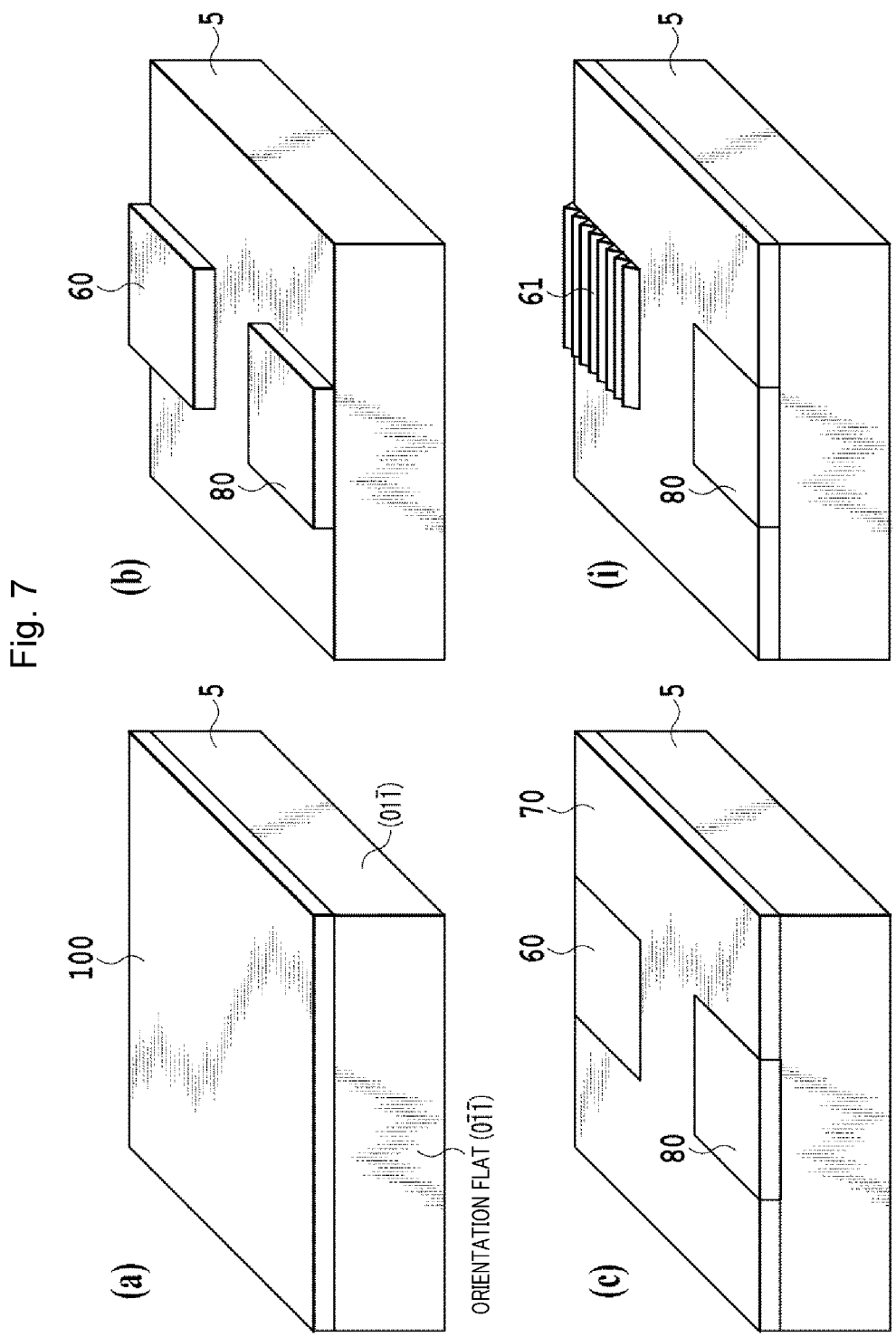
FIG. 7 is a diagram illustrating producing processes (a) to (c) and (i) of a conventional manufacturing method of a semiconductor light source element for comparison.
Figure 8:
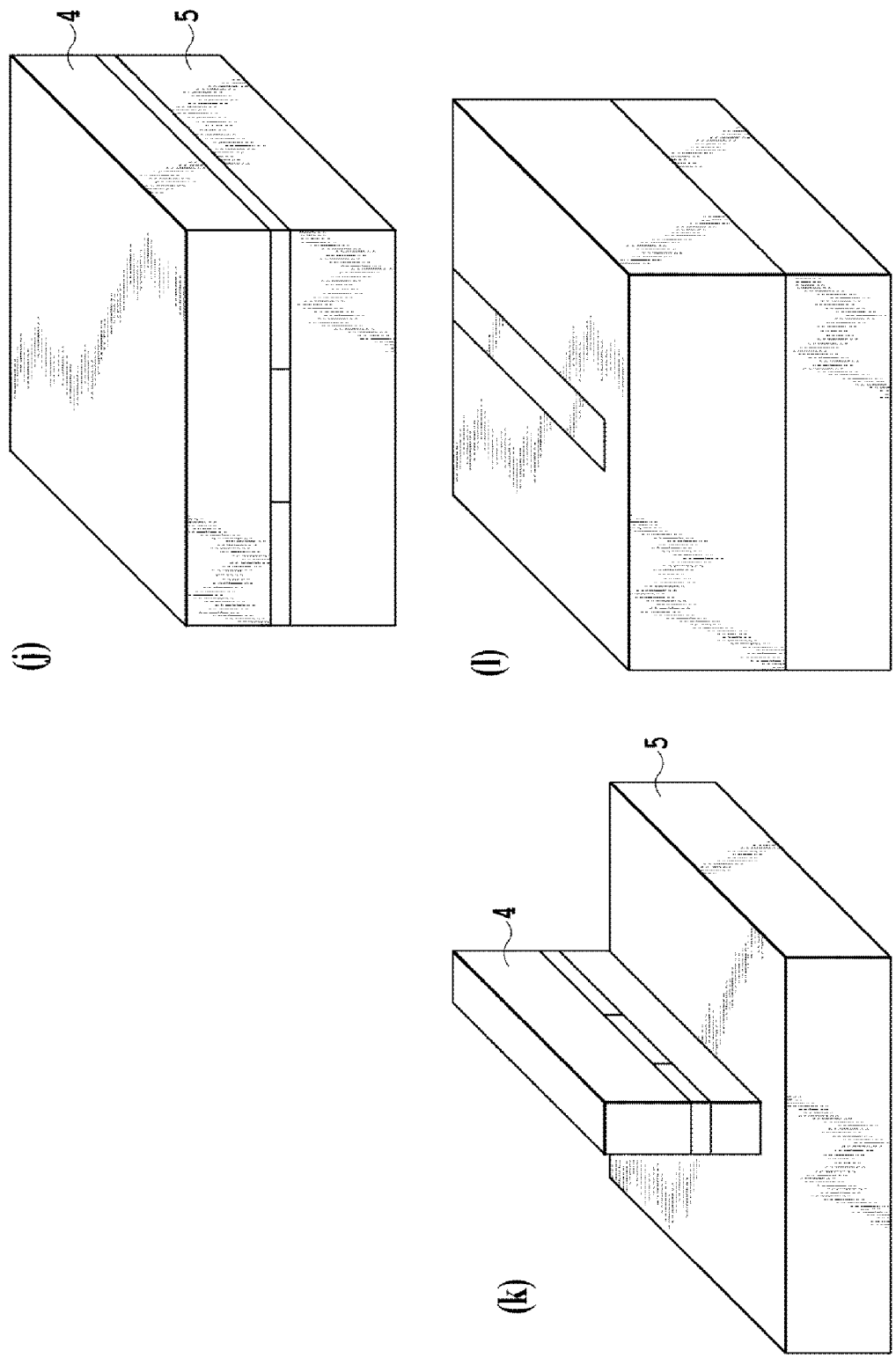
FIG. 8 is a diagram illustrating producing processes (j) to (l) of the conventional manufacturing method of the semiconductor light source element for comparison.

In order to compare characteristics, an element with the window structure portion of a length of 7 μm was also prepared using conventional processes. In the conventional processes shown in FIGS. 7 and 8, the processes of FIGS. 7(a) to 7(c) are the same as those of FIGS. 5(a) to 5(c) of the embodiment, but after that, without removing the portions of the active layer 80 and the EA layer 70, the diffraction grating 61 was formed to form the structure of FIG. 7(i), and the overclad layer 4 was formed to form the form of FIG. 8(j).

During the mesa processing of the conventional processes, the portion serving as the window structure was removed by etching from the state shown in FIG. 8(j) to form the structure shown in FIG. 8(k). Then, embedded growth was performed to obtain the shape shown in FIG. 8(l). However, since a portion of the lateral clad layers rises on the selective growth mask of the mesa, the process of removing the risen semiconductor was performed. Subsequent processes such as formation of electrodes are the same as in the embodiment.

(Comparison of Characteristics With Conventional Devices)

Figure 9:
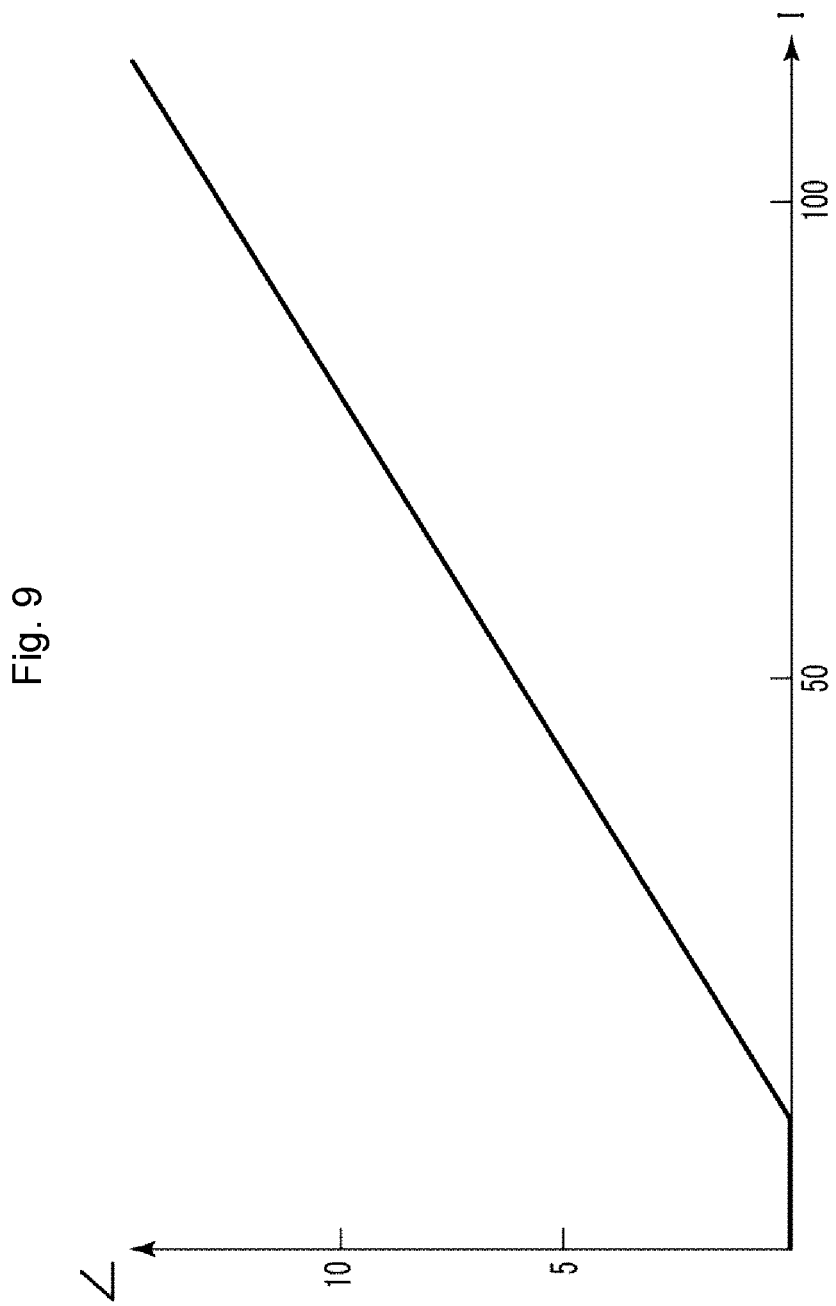
FIG. 9 is a diagram of current-light output characteristics of the semiconductor light source element according to the embodiment of the present invention.
Figure 10:
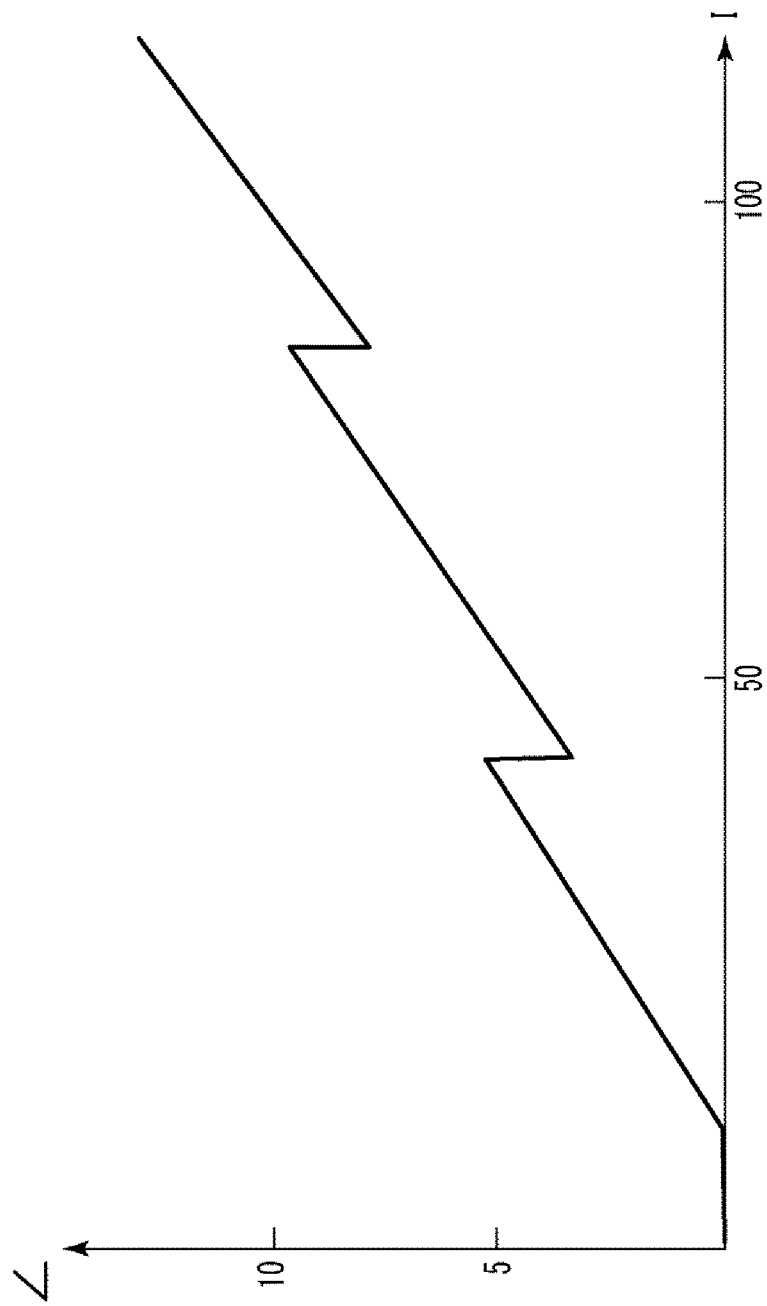
FIG. 10 is a diagram of current-light output characteristics of a conventional semiconductor light source element.

FIGS. 9 and 10 show and compare current-optical output characteristics (I-L characteristics) of the device of the embodiment thus produced and the device produced by the conventional processes, respectively. A horizontal axis of FIGS. 9 and 10 is a current value I (mA) when a current is passed through electrodes of DFB-LD and SOA as common terminals, and a vertical axis is a relative light output L.

As shown in FIG. 9, the device of the embodiment had ideal I-L characteristics without a kink (bending). On the other hand, in the devices manufactured using the conventional processes shown in FIGS. 7 and 8, voids (vacancies) were generated in an embedded layer portion near a boundary between the SOA and the window structure. For that reason, in the I-L characteristics of the conventional device shown in FIG. 10, a resonance state of laser was disturbed by reflected return light due to the voids, and the kink (bending) occurred in the I-L characteristics. This effect also has a strong effect on signal quality.

Figure 11:
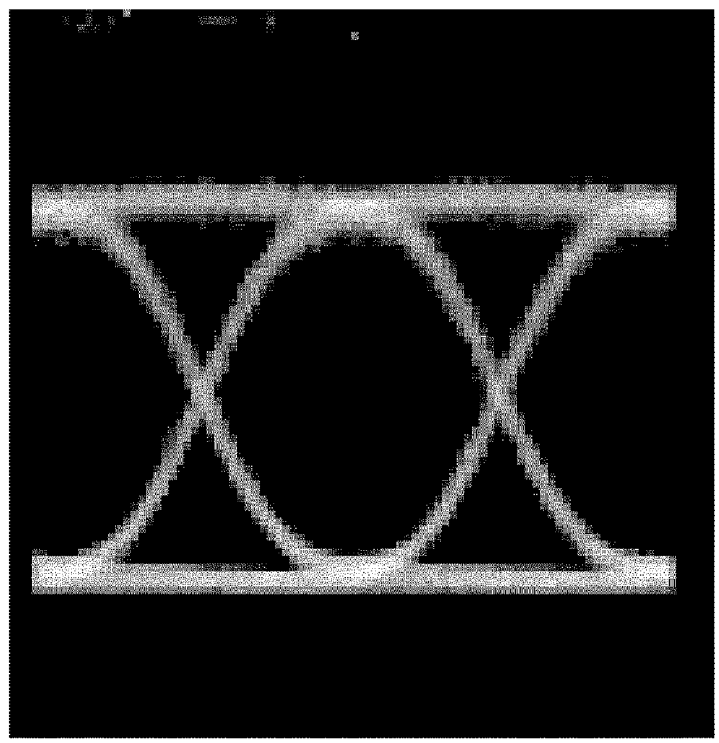
FIG. 11 is an eye waveform diagram of the semiconductor light source element according to the embodiment of the present invention.
Figure 12:
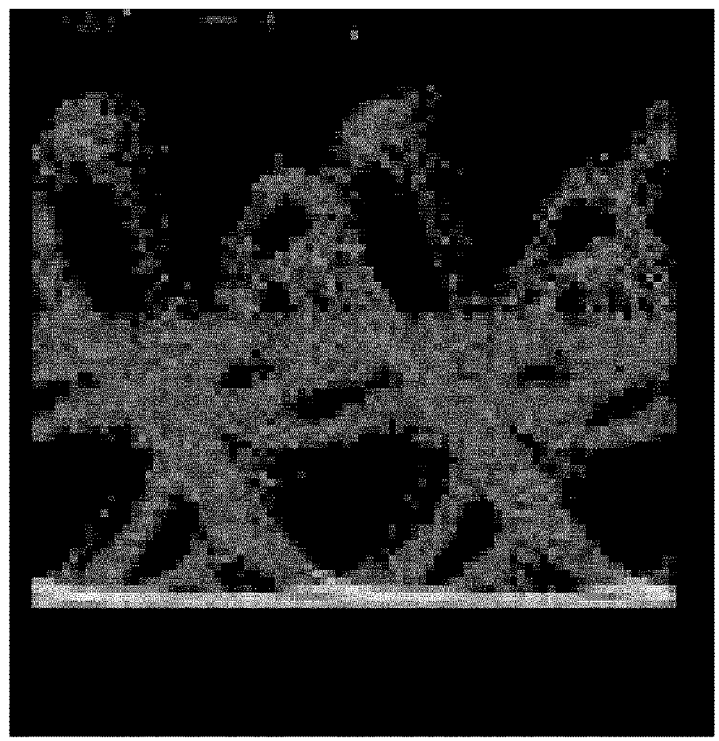
FIG. 12 is an eye waveform diagram of the conventional semiconductor light source element.

FIGS. 11 and 12 are eye waveforms (eye patterns) of modulated output signals when EA-modulated with 10 Gbps-NRZ signals in the devices of the embodiment and the conventional example. As shown in FIG. 11, in the device of the embodiment, an ideal good eye waveform was obtained. On the other hand, as shown in FIG. 12, in the conventional example, an oscillation state of the laser is disturbed by the reflected return light due to the voids, and quality of the eye waveform is clearly deteriorated.

(Length of Window Structure Portion)

A region length of the window structure portion is required to be designed to the optimum length in accordance with a shape of the optical waveguide. FIG. 13(a) shows a schematic diagram of a cross-sectional structure of the substrate at the window structure portion 9 of the embodiment. In FIG. 13(a), the traveling direction of the light emitted from the core layer 6 (7 and 8) of the optical waveguide toward the window structure portion 9 is a Z direction.

As described above, the window structure portion 9 is entirely made of InP and does not have a light confinement structure having a difference in refractive index such as a core layer and a clad layer. Therefore, incident light from the optical waveguide to the window structure 9 propagates (diffracts) in the Z direction while expanding a field diameter. This expansion angle depends on the shape of the waveguide at the emission end. Here, a core thickness is 250 nm, and a mesa width of the waveguide is 1.5 µm as described above.

FIG. 13(b) is a graph showing a vertical expansion of an optical field, in which a propagation distance z from an emission surface of the core layer is set on the horizontal axis, and a field width (a full width at half maximum (FWHM)) when intensity is halved with respect to the maximum intensity in a distribution of the optical field is plotted on the vertical axis. A wavelength of the light at this time is set to 1.3 µm.

As is clear from the graph of FIG. 13(b), the FWHM of the optical field reaches 2 µm when propagating in the window structure portion 9 by about 10 µm. That is, at this time, some of the optical field may reach an interface between the overclad layer and air.

In this case, in addition to a shape of the optical field being deformed, optical loss also occurs, which leads to deterioration of characteristics of the semiconductor element. Considering the above points, it is necessary to design the region length of the window structure portion to be a length that takes into consideration the field expansion of light.

Considering the expansion of the optical field in the case of using wavelengths in the 1.3 µm band and 1.55 µm band and assuming a general core layer thickness of 200 to 300 µm, the region length of the window structure portion is required to be 15 µm or less at the maximum.

Next, a case in which the region length of the window structure portion is short will be described. In the manufacturing process of the element, the length of the window structure portion is determined with cleavage. That is, the length of the window region portion is determined by forming an interface between the semiconductor and air, which is an end face of the element from which light is emitted, with cleavage. Therefore, regarding the region length of the window structure portion, it is necessary to consider an error of a positional deviation in a cleavage process. In the case of a short design, the end face formed by the cleavage will hit the waveguide, and the window structure itself will disappear. Considering the above points, it is necessary to design the region length of the window structure to be 5 µm or more in consideration of a manufacturing error due to the cleavage.

(Introduction of Tapered Structure of Window Structure)

As described above, the expanded state of the optical field incident on the window structure portion from the optical waveguide depends on a structure of the emission end of the optical waveguide. By adjusting the shape of the waveguide at a boundary between the optical waveguide and the window structure portion, it is possible to design the shape of the optical field emitted from the optical waveguide to the outside of the semiconductor element via the window structure portion.

Especially in semiconductor optical devices using general InP materials, a width of a core layer in a horizontal direction (equal to the mesa width) is 1.5 to 2.0 µm, while a thickness of a core layer in a vertical direction is 200 to 300 nm, which is an asymmetric structure in the horizontal and vertical directions. For this reason, a cross-sectional shape of the optical field emitted from the semiconductor element is generally elliptical, and in a case in which light is coupled to a cylindrical structure such as an optical fiber, the fact that it causes occurrence of a light loss has been exemplified as a problem.

Therefore, by adjusting the shape of the window structure portion and the optical waveguide adjacent to the window structure portion, the optical field can be deformed into a desired shape. That is, by causing horizontal and vertical sizes of the core layer of the optical waveguide to coincide with each other as much as possible, it is possible to make the field diameter of light close to a circle.

FIG. 14 shows a structural example of an embodiment in which a tapered region is provided inside the SOA. FIG. 14(c) is a top view of the chip showing the SOA and the window structure portion 9 (electrodes are not shown), FIGS. 14(a) and 14(b) are cross-sectional views of the substrate perpendicular to the optical axis in cross sections XIV-A and XIV-B in FIG. 14(c).

Here, an example in which the tapered structure 19 is provided in the optical waveguide near the window structure portion 9 in the optical waveguide 8 inside the SOA is shown. When the tapered structure 19 is made too steep, light loss will occur, and thus the tapered structure having a length of 50 µm is used here. The mesa width of the SOA portion other than the tapered structure portion 19 is 1.5 µm, and the mesa width is reduced to 1.0 µm by the tapered structure 19 and reaches the window structure portion 9.

Since this structure can be manufactured only by changing the design of the mesa structure, it can be manufactured in the same process as the manufacturing process described above. The mesa width at a boundary between a tail end of the tapered structure 19 and the window structure portion 9 is 1.0 µm. This was designed in consideration of manufacturing accuracy at the time of mesa formation, and in the case of adopting a mesa width smaller than this, there is a possibility that a narrow mesa portion disappears due to a manufacturing error during the manufacturing process, and the boundary between the optical waveguide and the window structure portion recedes.

The maximum mesa width of about 2.0 µm is adopted for a general InP-based semiconductor element, and considering a manufacturing tolerance in the case of adopting a high-mesa insulating embedded structure like the above one, the narrowed mesa width due to the taper is preferably 1.5 µm or less and 1.0 µm or more. As a result of confirming a coupling efficiency of the light emitted from the end face with an optical fiber in the optical device with the window structure that uses a waveguide width of 1.0 µm due to the taper described above, it was confirmed that an optical coupling loss was improved by about 2 dB as compared with a conventional optical device having a waveguide structure with a mesa width of 1.5 µm.

INDUSTRIAL APPLICABILITY

As described above, in the semiconductor optical device of the present invention and the manufacturing method thereof, the optical semiconductor waveguide having the window structure with few vacancies and crystal defects is realized with a high-mesa semi-insulating embedded structure, and the semiconductor light source element and the optical device that enable a high output, a low loss, and high-speed modulation can be realized.

The invention claimed is:
1. A method for manufacturing a semiconductor light source element, the method comprising:
   forming an active layer on an InP substrate, wherein the active layer is a crystal grown layer and wherein a crystal orientation of a surface thereof was a (1 0 0) plane and an orientation flat thereof was a (0 −1 −1) plane;

forming a first etching mask on the active layer, and removing a part of the active layer, wherein a remaining part of the active layer is perpendicular to the orientation flat;

forming an EA (Electro-Absorption) layer, wherein the EA layer is a crystal grown layer and wherein the EA layer forms a core layer of an EA modulator, without removing the first etching mask;

removing the first etching mask and forming a second etching mask on the active layer;

partially removing the EA layer, such that a region serving as a window structure remains, wherein the region remaining is wider than a mesa stripe;

removing the second etching mask and then forming the window structure by forming an overclad layer on an entire surface; and forming a third etching mask on the overclad layer, and then forming the mesa stripe by removing each of the overclad layer, the active layer, the EA layer, and a part of the InP substrate, wherein the mesa strip has a height of at least 3 µm.

2. The method for manufacturing the semiconductor light source element according to claim 1, wherein the method further comprises:

forming a diffraction grating on a part of the active layer after removing the second etching mask.

3. The method for manufacturing the semiconductor light source element according to claim 2, wherein the forming the EA layer comprises regrowing through butt joint growth.

4. The method for manufacturing the semiconductor light source element according to claim 3, wherein the method further comprises, in the forming of the first etching mask on the active layer and the removing of the part the active layer, removing the active layer partially so that the remaining part of the active layer is divided into a first active layer to form the diffraction grating located on an input side and a second active layer to be a semiconductor optical layer (SOA layer) located on an output side, wherein the window structure is formed in an output side of the SOA layer.

* * * * *